United States Patent
Nagamoto et al.

(10) Patent No.: US 6,723,619 B2
(45) Date of Patent: Apr. 20, 2004

(54) PRESSURE SENSITIVE ADHESIVE SHEET FOR SEMICONDUCTOR WAFER PROCESSING

(75) Inventors: Koichi Nagamoto, Saitama (JP); Kazuyoshi Ebe, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/150,686

(22) Filed: May 17, 2002

(65) Prior Publication Data

US 2003/0008139 A1 Jan. 9, 2003

(30) Foreign Application Priority Data

May 18, 2001 (JP) ........................................ 2001-149878

(51) Int. Cl.$^7$ ........................ H01L 21/46; H01L 21/461; H01L 21/302; H01L 21/3065
(52) U.S. Cl. ........................ 438/459; 438/26; 438/118; 438/706; 438/976; 438/977
(58) Field of Search ........................ 438/26, 118, 459, 438/706, 976, 977; 522/18, 28, 38, 64; 428/345, 355 R

(56) References Cited

U.S. PATENT DOCUMENTS

| | | | | |
|---|---|---|---|---|
| 4,719,297 A | * | 1/1988 | Henne et al. ................ 544/107 |
| 6,224,976 B1 | * | 5/2001 | Takushima et al. ...... 428/355 R |
| 6,294,439 B1 | * | 9/2001 | Sasaki et al. ................ 438/464 |
| 6,337,258 B1 | * | 1/2002 | Nakayoshi et al. .......... 438/464 |
| 6,376,070 B1 | * | 4/2002 | Nakasuga et al. ...... 428/355 EP |
| 6,472,065 B1 | * | 10/2002 | Alahapperuma et al. ..... 428/343 |
| 6,517,776 B1 | * | 2/2003 | Rodgers et al. ................ 422/24 |
| 6,524,700 B2 | * | 2/2003 | Masuda et al. ............. 428/343 |
| 6,524,701 B1 | * | 2/2003 | Kondo et al. .......... 428/355 RA |
| 2001/0023264 A1 | * | 9/2001 | Yamamoto .................... 522/39 |

FOREIGN PATENT DOCUMENTS

| | | |
|---|---|---|
| DE | 199 07 957 A1 | 9/1999 |
| EP | 1 170 345 A | 1/2002 |
| JP | 5-32946 A | 2/1993 |
| JP | 8-027239 A | 1/1996 |
| JP | 10-130591 A | 5/1998 |

* cited by examiner

Primary Examiner—Jeffrey B. Robertson
(74) Attorney, Agent, or Firm—Webb Ziesenheim Logsdon Orkin & Hanson, P.C.

(57) ABSTRACT

Disclosed herein is a pressure sensitive adhesive sheet for fixing a semiconductor wafer during semiconductor wafer processing in vacuum, comprising a substrate and, superimposed on one side or both sides thereof, a layer of ultraviolet curable pressure sensitive adhesive composition comprising an ultraviolet curable copolymer having ultraviolet polymerizable groups as side chains and a phosphorous photopolymerization initiator. The pressure sensitive adhesive sheet for semiconductor wafer processing, even in the processing of a semiconductor wafer in vacuum, is free from generating gases from the pressure sensitive adhesive sheet, thereby avoiding wafer deformation attributed to evaporated gas components and adhesive transfer caused thereby.

8 Claims, No Drawings

PRESSURE SENSITIVE ADHESIVE SHEET FOR SEMICONDUCTOR WAFER PROCESSING

FIELD OF THE INVENTION

The present invention relates to a pressure sensitive adhesive sheet for semiconductor wafer processing. More particularly, the present invention relates to a pressure sensitive adhesive sheet which is suitable to the processing of semiconductor wafers in vacuum.

BACKGROUND OF THE INVENTION

It is common practice to subject a semiconductor wafer having circuits formed on its surface to grinding of a back side thereof so as to remove an oxide layer on the back side or so as to reduce and uniformalize the thickness of the semiconductor wafer. In particular, in recent years, the semiconductor wafer is occasionally ground to a thickness of 100 μm or less in accordance with the demand for reduction of chip thickness. At the grinding of the back side of semiconductor wafer, a pressure sensitive adhesive sheet is stuck to the circuit surface of semiconductor wafer so as to protect the circuits or so as to fix the semiconductor wafer.

The above reduction of semiconductor wafer thickness deteriorates antifolding strength of the wafer due to grinding marks on the back side of semiconductor wafer which has resulted from mechanical grinding with the use of a grindstone, a grinder or the like. Therefore, it is proposed to remove the grinding marks on the back side of semiconductor wafer by dry etching.

This dry etching is generally performed in a vacuum of $10^{-3}$ to $10^{-4}$ torr. However, in such a vacuum, when fixing semiconductor wafer with the use of conventional ultraviolet curable pressure sensitive adhesive sheets, such a problem has occasionally invited that volatile components come out from the layer of ultraviolet curable pressure sensitive adhesive of the ultraviolet curable pressure sensitive adhesive sheet with the result that generated gases from volatile components contained in the layer of ultraviolet curable pressure sensitive adhesive are trapped between the semiconductor wafer of extremely reduced thickness and the ultraviolet curable pressure sensitive adhesive sheet, thereby causing the semiconductor wafer to deform due to a pressure difference between outside and inside the semiconductor wafer to stick pressure sensitive adhesive sheet. This deformation of semiconductor wafer has occasionally caused the pressure sensitive adhesive to remain stuck to deformed portions (dented portions) of the semiconductor wafer, even after the stripping of the pressure sensitive adhesive sheet, to thereby foul the semiconductor wafer.

The present invention has been made in view of the above state of the prior art. It is an object of the present invention to provide a pressure sensitive adhesive sheet for semiconductor wafer processing which, even in the processing of a semiconductor wafer in vacuum, is free from generating gases from the pressure sensitive adhesive sheet to thereby enable avoiding wafer deformation and adhesive transfer.

SUMMARY OF THE INVENTION

The pressure sensitive adhesive sheet for semiconductor wafer processing according to the present invention is a pressure sensitive adhesive sheet used to fix a semiconductor wafer in semiconductor wafer processing in vacuum, which comprises:

a substrate and, superimposed on one side or both sides thereof, a layer of ultraviolet curable pressure sensitive adhesive composition comprising an ultraviolet curable copolymer having ultraviolet polymerizable groups as side chains and a phosphorous photopolymerization initiator.

In the present invention, it is preferred that the phosphorous photopolymerization initiator be an acylphosphine oxide compound, preferably a compound having a CO—PO bond in its molecule, and still preferably a compound represented by the formula:

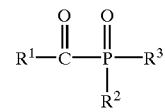

wherein $R^1$ represents an aromatic group which may have substituent, and each of R and $R^3$ independently represents phenyl group, alkyl group, alkoxy group or aromatic acyl group which may have substituent.

In the present invention, it is preferred that the layer of ultraviolet curable pressure sensitive adhesive composition contain 0.005 to 20 parts by weight of phosphorous photopolymerization initiator per 100 parts by weight of the ultraviolet curable copolymer.

DETAILED DESCRIPTION OF THE INVENTION

The present invention will be described in greater detail below. The pressure sensitive adhesive sheet for semiconductor wafer processing according to the present invention is a pressure sensitive adhesive sheet used to fix a semiconductor wafer in semiconductor wafer processing in vacuum, which comprises:

a substrate and, superimposed on one side or both sides thereof, a layer of ultraviolet curable pressure sensitive adhesive composition comprising an ultraviolet curable copolymer (A) having ultraviolet polymerizable groups as side chains and a phosphorous photopolymerization initiator (B).

The ultraviolet curable copolymer (A) exhibits not only stickiness but also ultraviolet curability. Details of the ultraviolet curable copolymer having ultraviolet polymerizable groups as side chains are described in, for example, Japanese Patent Laid-open Publication Nos. 5(1993)-32946 and 8(1996)-27239.

For example, the ultraviolet curable copolymer (A) is obtained by reacting an acrylic copolymer (a1) comprising units of a monomer containing a functional group with a compound (a2) containing an unsaturated group which has a substituent reactive with the above functional group.

The monomer containing a functional group refers to a monomer having in its molecule not only a polymerizable double bond but also a functional group such as a hydroxyl group, a carboxyl group, an amino group, a substituted amino group or an epoxy group. Preferably, an unsaturated compound containing a hydroxyl group or an unsaturated compound containing a carboxyl group is employed.

Specific examples of these functional group containing monomers include an acrylate containing a hydroxyl group, such as 2-hydroxyethyl acrylate, 2-hydroxyethyl methacrylate, 2-hydroxypropyl acrylate or 2-hydroxypropyl methacrylate; and a compound containing a carboxyl group, such as acrylic acid, methacrylic acid or itaconic acid.

The above functional group containing monomers may be used individually or in combination. The acrylic copolymer (a1) is composed of structural units derived from the above monomer containing a functional group and structural units derived from a (meth)acrylic ester monomer or a derivative thereof. As the (meth)acrylic ester monomer, there can be used a cycloalkyl (meth)acrylate, benzyl (meth)acrylate or an alkyl (meth)acrylate in which the alkyl group has 1 to 18 carbon atoms. Of these, an alkyl (meth)acrylate in which the alkyl group has 1 to 18 carbon atoms is especially preferred which is, for example, methyl acrylate, methyl methacrylate, ethyl acrylate, ethyl methacrylate, propyl acrylate, propyl methacrylate, butyl acrylate or butyl methacrylate.

The acrylic copolymer (a1) generally contains the above structural units derived from the monomer containing a functional group in an amount of 3 to 100% by weight, preferably 5 to 40% by weight, and still preferably 10 to 30% by weight. Further, the acrylic copolymer (a1) generally contains the above structural units derived from the (meth)acrylic ester monomer or derivative thereof in an amount of 0 to 97% by weight, preferably 60 to 95% by weight, and still preferably 70 to 90% by weight.

The acrylic copolymer (a1) is obtained by copolymerizing the above monomer containing a functional group with the above (meth)acrylic ester monomer or derivative thereof according to the customary procedure. In this copolymerization, a small amount (for example, 10% by weight or less, preferably 5% by weight or less) of another monomer such as vinyl formate, vinyl acetate or styrene may be used in addition to the above monomers.

The ultraviolet curable copolymer (A) can be obtained by reacting the above acrylic copolymer (a1) comprising units of a monomer containing a functional group with a compound (a2) containing an unsaturated group which has a substituent reactive with the above functional group.

The compound (a2) containing an unsaturated group contains a substituent reactive with the functional group of the acrylic copolymer (a1). This substituent can be various depending on the type of the above functional group. For example, when the functional group is a hydroxyl or carboxyl group, the substituent is preferably an isocyanato, an epoxy group or the like. When the functional group is an amino or a substituted amino group, the substituent is preferably an isocyanato group or the like. When the functional group is an epoxy group, the substituent is preferably a carboxyl group. With respect to these substituents, one thereof is contained in every molecule of compound (a2) containing an unsaturated group.

Further, 1 to 5, preferably 1 to 2, ultraviolet polymerizable carbon to carbon double bonds are contained in the compound (a2) containing an unsaturated group. As examples of such unsaturated group containing compounds (a2), there can be mentioned:

methacryloyloxyethyl isocyanate, metha-isopropenyl-α, α-dimethylbenzyl isocyanate, methacryloyl isocyanate and allyl isocyanate;

acryloyl monoisocyanate compounds each obtained by reacting a diisocyanate or polyisocyanate compound with hydroxyethyl (meth)acrylate;

acryloyl monoisocyanate compounds each obtained by reaction of a mixture of a diisocyanate or polyisocyanate compound, a polyol compound and hydroxyethyl (meth)acrylate;

glycidyl (meth)acrylate; and (meth)acrylic acid.

The compound (a2) containing an unsaturated group is generally used in a proportion of 20 to 100 equivalents, preferably 40 to 95 equivalents, and still preferably 60 to 90 equivalents, per 100 equivalents of the functional group containing monomer of the above acrylic copolymer (a1) The reaction between the acrylic copolymer (a1) and the compound (a2) containing an unsaturated group is generally conducted at about room temperature under atmospheric pressure over a period of about 24 hr. It is preferred that this reaction be effected in a solution, for example, an ethyl acetate solution in the presence of a catalyst such as dibutyltin laurate.

As a result, each functional group present in side chains of the acrylic copolymer (a1) reacts with the substituent of the compound (a2) containing an unsaturated group, so that the unsaturated group is introduced in side chains of the acrylic copolymer (a1), thereby obtaining the ultraviolet curable copolymer (A). In this reaction, the ratio of reaction between the functional group and the substituent is generally at least 70%, preferably at least 80%. Unreacted functional groups may remain in the ultraviolet curable copolymer (A).

The ultraviolet curable copolymer (A) has a molecular weight of at least 100,000, preferably in the range of 150,000 to 1,500,000, and still preferably in the range of 200,000, to 1,000,000. The ultraviolet curable copolymer (A) generally has a glass transition temperature of up to 20° C., preferably about −70 to 0° C. The ultraviolet curable copolymer (A) exhibits stickiness at room temperature (23° C.) Further, in the ultraviolet curable copolymer (A), generally $1 \times 10^{22}$ to $1 \times 10^{24}$, preferably $2 \times 10^{22}$ to $5 \times 10^{23}$, and still preferably $5 \times 10^{22}$ to $2 \times 10^{23}$, ultraviolet polymerizable unsaturated groups are contained per 100 g thereof.

Ultraviolet polymerizable unsaturated groups are contained in this ultraviolet curable copolymer (A), so that the ultraviolet curable copolymer (A), when irradiated with ultraviolet, undergoes polymerization and curing with the result that the stickiness thereof is lost.

The ultraviolet curable pressure sensitive adhesive composition for use in the present invention comprises the above known ultraviolet curable copolymer (A) and a phosphorous photopolymerization initiator (B).

The phosphorous photopolymerization initiator (B) refers to a compound containing phosphorus in its molecule, which, when exposed to ultraviolet radiation, generates radicals capable of initiating polymerization. This phosphorous photopolymerization initiator (B) is preferably an acyiphosphine oxide compound, still preferably a compound having a CO—PO bond in its molecule. The molecular weight of phosphorous photopolymerization initiator (B) is preferably in the range of 100 to 2000, still preferably 200 to 1000.

As this phosphorous photopolymerization initiator (B) there is especially preferably used a compound represented by the formula:

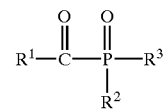

wherein $R^1$ represents an aromatic group which may have substituent. Preferably, it is, for example, dimethylphenyl, trimethylphenyl, trimethoxyphenyl, dimethoxyphenyl or phenyl.

Each of $R^2$ and $R^3$ independently represents phenyl group, alkyl group, alkoxy group or aromatic acyl group which may have substituent.

The phenyl group which may have substituent is preferably, for example, dimethylphenyl, trimethylphenyl, trimethoxyphenyl, dimethoxyphenyl or phenyl. Still preferably, it is phenyl.

The alkyl group which may have substituent is preferably, for example, 2-methylpropyl or 2,4,4-trimethylpentyl. Still preferably, it is 2,4,4-trimethylpentyl.

It is especially preferred that the alkoxy group which may have substituent be an ethoxy group.

The aromatic acyl group which may have substituent is preferably a group of the formula $R^1CO$—($R^1$ is as defined above).

Therefore, the phosphorous photopolymerization initiator especially preferably employed in the present invention can be, for example, bis(2,4,6-trimethylbenzoyl)-phenylphosphine oxide of the formula:

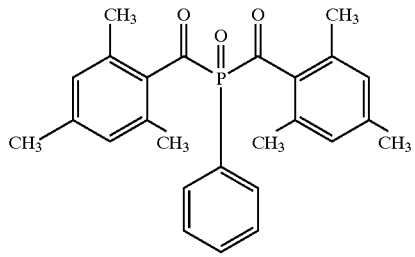

2, 4, 6-trimethylbenzoyldiphenylphosphine oxide of the formula:

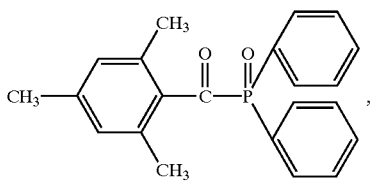

or bis(2,6-dimethoxybenzoyl)-2,4,4-trimethyl-pentylphosphine oxide of the formula:

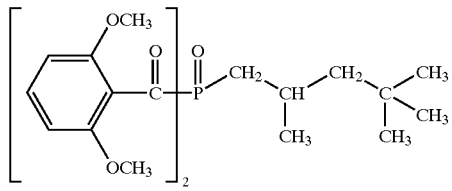

These phosphorous photopolymerization initiators (B) may be used individually or in combination.

In the ultraviolet curable pressure sensitive adhesive composition for use in the present invention, the phosphorous photopolymerization initiator (B) is preferably contained in an amount of 0.005 to 20 parts by weight, still preferably 0.01 to 10 parts by weight, and optimally 0.05 to 1 part by weight, per 100 parts by weight of ultraviolet curable copolymer (A).

The ultraviolet curable pressure sensitive adhesive composition does not contain any significant amount of volatile low-molecular-weight compounds. Therefore, even in a high vacuum, evaporation or sublimation of components from the pressure sensitive adhesive composition would not occur. Accordingly, when even an extremely thin semiconductor wafer is stuck to the layer of this pressure sensitive adhesive composition, the semiconductor wafer can be supported without being deformed.

This ultraviolet curable pressure sensitive adhesive composition exhibits satisfactory adherence to an adherend before irradiation with ultraviolet, but, after the irradiation with ultraviolet, the adherence is markedly reduced. That is, before the irradiation with ultraviolet, the ultraviolet curable pressure sensitive adhesive composition sticks the pressure sensitive adhesive sheet to the semiconductor wafer with satisfactory adherence to thereby attain supporting and fixing of the semiconductor wafer. After the irradiation with ultraviolet, the pressure sensitive adhesive composition permits easily peeling the pressure sensitive adhesive sheet from the processed semiconductor wafer.

A crosslinking agent can be added to the ultraviolet curable pressure sensitive adhesive composition in order to increase the elastic modulus thereof and to cause it to have satisfactory cohesive strength. The crosslinking agent converts the ultraviolet curable pressure sensitive adhesive composition into a three-dimensional crosslink structure to thereby impart satisfactory elastic modulus and cohesive strength thereto. Common crosslinking agents such as polyisocyanate compounds, polyepoxy compounds, polyaziridine compounds and chelate compounds can be used. Examples of the polyisocyanate compounds include toluylene diisocyanate, diphenylmethane diisocyanate, hexamethylene diisocyanate, isophorone diisocyanate and adducts of these polyisocyanates and polyhydric alcohols. Examples of the polyepoxy compounds include ethylene glycol diglycidyl ether and diglycidyl terephthalate acrylate. Examples of the polyaziridine compounds include tris-2,4, 6-(1-aziridinyl)-1,3,5-triazine and tris[1-(2-methyl) aziridinyl]triphosphatriazine. Examples of the chelate compounds include ethylacetoacetatoaluminum diisopropylate and aluminum tris (ethylacetoacetate). These compounds can be used individually or in combination.

The crosslinking agent is preferably added in an amount of 0.005 to 20 parts by weight, still preferably 0.01 to 10 parts by weight, per 100 parts by weight of ultraviolet curable pressure sensitive adhesive composition.

This ultraviolet curable pressure sensitive adhesive composition is obtained by appropriately mixing together the above components and other components added according to necessity.

The pressure sensitive adhesive sheet for semiconductor wafer processing according to the present invention comprises a substrate coated with the above ultraviolet curable pressure sensitive adhesive composition. The pressure sensitive adhesive sheet may be a pressure sensitive adhesive one-side coated sheet or a pressure sensitive adhesive double coated sheet.

The type of substrate is not particularly limited, and various thin layer items can be used as the substrate. For example, use can be made of synthetic resin films. Examples of the synthetic resin films which can be employed in the present invention include:

polyolefin films such as a polyethylene film, a polypropylene film, a polybutene film and a polymethylpentene film;

a polyvinyl chloride film, a polyvinylidene chloride film, a polyethylene terephthalate film, a polyethylene naphthalate film, a polybutylene terephthalate film, a polybutadiene film, a polyurethane film, an ethylene/vinyl acetate copolymer film, an ethylene/(meth)acrylic acid copolymer film, an ethylene/(meth)acrylic ester copolymer film, an ionomer film, a polystyrene film, a polyamide film, a polyimide film, a polyether sulfone film and a polyether ether ketone film.

The thickness of each of these substrates is generally in the range of 5 to 300 μm, preferably 10 to 200 μm. The substrate may be a monolayer item or laminate of the above various films. In the event of dry etching of the semiconductor wafer, a reaction heat of about 100 to 200° C. may occur. Thus, in that event, the substrate is preferably constituted of a thermally stable film of, for example, polyethylene terephthalate, polyethylene naphthalate, polyimide, polyether sulfone or polyether ether ketone.

The substrate on its side to be provided with the layer of ultraviolet curable pressure sensitive adhesive may undergo corona treatment or may have another layer such as a primer attached thereto for the purpose of improving the adherence of the substrate to the ultraviolet curable pressure sensitive adhesive.

The pressure sensitive adhesive sheet for semiconductor wafer processing of the present invention can be obtained by coating the above substrate with an appropriate thickness of the above ultraviolet curable pressure sensitive adhesive composition according to the customary technique employing a roll coater, a knife coater, a gravure coater, a die coater, a reverse coater or the like and drying the ultraviolet curable pressure sensitive adhesive compositions. The thickness of the layer of ultraviolet curable pressure sensitive adhesive composition is generally in the range of 1 to 100 μm, preferably 5 to 50 μm. After the coating and drying, when considered necessary, a release liner may be applied onto the layer of ultraviolet curable pressure sensitive adhesive composition in order to protect the same.

With respect to the method of using the ultraviolet curable pressure sensitive adhesive sheet for semiconductor wafer processing according to the present invention, each step thereof will be described below with reference to a process mode wherein mechanical grinding of a back surface of semiconductor wafer is followed by dry etching of ground surface.

In this process mode, first, a circuit pattern is formed on a surface of semiconductor wafer by customary technique. Subsequently, the layer of ultraviolet curable pressure sensitive adhesive composition of the above pressure sensitive adhesive sheet is stuck to the formed circuit surface of the semiconductor wafer, thereby effecting not only the protection of the circuit surface of the semiconductor wafer but also the fixing of the semiconductor wafer.

The pressure sensitive adhesive sheet, as aforementioned, may be a pressure sensitive adhesive one-side coated sheet or a pressure sensitive adhesive double coated sheet. In the use of a pressure sensitive adhesive double coated sheet, it is preferred that the pressure sensitive adhesive layer opposite to the side stuck to the semiconductor wafer be stuck to a transparent hard plate of, for example, glass. In the use of a pressure sensitive adhesive double coated sheet, both the pressure sensitive adhesive layers are constituted of the above ultraviolet curable pressure sensitive adhesive composition.

When the semiconductor wafer is stuck to the pressure sensitive adhesive sheet in the above manner, even if the semiconductor wafer is extremely thin, the strength thereof can be retained to thereby enable avoiding damaging of semiconductor wafer during the transportation or storage thereof.

Thereafter, mechanical grinding of the back surface of semiconductor wafer is carried out by customary technique. Mechanical grinding, as compared with dry etching, enables efficient grinding of semiconductor wafer and hence enables reducing the thickness of semiconductor wafer within a short period of time. However, grinding marks (broken layer) inevitably occur due to, for example, a grindstone used. Such grinding marks would lower the antifolding strength of semiconductor wafer and chips and would cause cracking thereof.

Therefore, it is proposed to remove these grinding marks by dry etching. The dry etching is performed by spraying an etching gas of, for example, $SF_6$ over the back surface of semiconductor wafer in a high vacuum ($10^{-3}$ to $10^{-4}$ torr) This dry etching, without applying a mechanical load onto the semiconductor wafer, can reduce the thickness of semiconductor wafer and further can remove grinding marks, so that an extremely thin flawless semiconductor wafer of 100 μm or less thickness can be obtained thereby. Furthermore, the ultraviolet curable pressure sensitive adhesive composition of specified formulation is used in the above pressure sensitive adhesive sheet for semiconductor wafer processing according to the present invention, so that, even in a high vacuum, there are no volatile components, thereby enabling avoiding any deformation of semiconductor wafer attributed to a pressure difference of evaporated gas components between outside and inside the semiconductor wafer to stick pressure sensitive adhesive sheet. Still further, if the semiconductor wafer is deformed, the pressure sensitive adhesive would be stripped from the semiconductor wafer, and the etching gas would act on peeled surface of the pressure sensitive adhesive to thereby alter the properties of pressure sensitive adhesive with the result that an adhesive transfer would occur. However, when the pressure sensitive adhesive sheet for semiconductor wafer processing according to the present invention is employed, deformation of the semiconductor wafer can be avoided, thereby enabling preventing any adhesive transfer.

Still further, the processing with the use of the pressure sensitive adhesive sheet for semiconductor wafer processing according to the present invention may be a film formation in vacuum.

After the completion of requisite steps, the ultraviolet curable pressure sensitive adhesive layer of the pressure sensitive adhesive sheet is irradiated with ultraviolet, so that the ultraviolet polymerizable components contained in the ultraviolet curable pressure sensitive adhesive layer are polymerized and cured. Upon polymerization and curing of the pressure sensitive adhesive composition layer by irradiating the same with ultraviolet, the adherence of the pressure sensitive adhesive composition will be extremely lowered, resulting in remaining of only a slight tack. Therefore, the semiconductor wafer can be easily detached from the pressure sensitive adhesive sheet.

The above pressure sensitive adhesive sheet for semiconductor wafer processing according to the present invention, because of the fixing of semiconductor wafer with the use of the layer of pressure sensitive adhesive composed of specified components, is free from generating gases from the pressure sensitive adhesive layer even in a high vacuum, thereby enabling avoiding any deformation of semiconductor wafer attributed to a pressure difference caused by evaporated gas components and an adhesive transfer caused thereby.

EXAMPLE

The present invention will further be illustrated below with reference to the following Examples which in no way limit the scope of the invention.

The following materials were used as the ultraviolet curable copolymer, photopolymerization initiator and other components.

A "Ultraviolet Curable Copolymer"

This ultraviolet curable copolymer was obtained by reacting 100 parts by weight of a copolymer of 650,000 weight average molecular weight, which copolymer was composed of 85 parts by weight of n-butyl acrylate and 15 parts by weight of 2-hydroxyethyl acrylate, with 16 parts by weight of methacryloyloxyethyl isocyanate.

B "Photopolymerization Initiator"

B1: bis(2,4,6-trimethylbenzoyl)phenylphosphine oxide, and

B2: 1-hydroxycyclohexyl phenyl ketone.

C "Ultraviolet Curable Pressure Sensitive Adhesive"

A copolymer of 500,000 weight average molecular weight composed of 90 parts by weight of butyl acrylate and 10 parts by weight of acrylic acid was obtained. Dipentaerythritol hexaacrylate as an ultraviolet curable component was added thereto in an amount of 150 parts by weight (solid contents) per 100 parts by weight (solid contents) of the copolymer.

D "Crosslinking Agent"

Adduct of toluylene diisocyanate and trimethylolpropane.

Example 1

An ultraviolet curable pressure sensitive adhesive composition was obtained by mixing together components listed in Table 1 in ratios specified in Table 1. A release liner (obtained by treating a polyethylene terephthalate film with a silicone release agent and having a thickness of 38 $\mu$m) was coated with the obtained ultraviolet curable pressure sensitive adhesive composition. The resultant layer of ultraviolet curable pressure sensitive adhesive composition was transferred onto one side of a substrate (polyethylene terephthalate film having a thickness of 50 $\mu$m), thereby obtaining a pressure sensitive adhesive one-side coated sheet having a 20 $\mu$m thick layer of ultraviolet curable pressure sensitive adhesive. The other side of the substrate was also provided with a 20 $\mu$m thick layer of ultraviolet curable pressure sensitive adhesive in the same manner. Thus, a pressure sensitive adhesive double coated sheet was obtained.

An 8-inch silicon wafer (thickness: 725 $\mu$m) was fixed on a transparent hard plate (soda lime glass of 700 $\mu$m thickness and 200 mm diameter) by means of the obtained pressure sensitive adhesive double coated sheet interposed therebetween. Mechanical grinding of the silicon wafer was effected to a thickness of 50 $\mu$m by the use of wafer back surface grinding machine (DFG-840, manufactured by Disco Corporation). Thereafter, $SF_6$ was sprayed over the exposed surface of the silicon wafer in a vacuum of 0.3 torr to thereby carry out a dry etching. The thickness of the silicon wafer was reduced to 48 $\mu$m.

The "number of breakages", "gas" and "adhesive transfer" were evaluated in the following manner.

"Number of Breakages"

After the completion of dry etching, the number of breakages observed per silicon wafer was counted.

"Gas"

A 1 cm square sample was cut out from the pressure sensitive adhesive double coated sheet, and heated in a helium stream (flow rate: 50 ml/min) at 150° C. for 10 min. Gas carried by helium stream was adsorbed on a glass wool adsorbent (−60° C.), and the outgas was measured by gas chromatograph mass spectrometry. In this measurement, use was made of column HP-5 manufactured by Agilent Technologies Inc. (60 mm×0.25 mm×1.0 $\mu$m), and helium was flowed at a flow rate of 1.5 ml/min. The molecular weight ranged from 10 to 500 m/z, and heating was performed at 50° C. for 2 min to 280° C. for 20 min (rate of temperature rise: 10° C./min). Provided that the amount of outgas was determined in terms of n-decane.

"Adhesive Transfer"

Chips of 10 mm×10 mm size were prepared, and the adherent surface of each of 20 chips sampled therefrom was observed through a microscope of 50 magnification, thereby inspecting the occurrence of adhesive transfers.

The results are listed in Table 1.

Example 2

The same procedure as in Example 1 was repeated except that a polyethylene naphthalate film of 50 $\mu$m thickness was used as the substrate. The results are listed in Table 1.

Comparative Example 1

The same procedure as in Example 1 was repeated except that, in place of the compound B1, the compound B2 was used in an amount of 6 parts by weight as the photopolymerization initiator. The results are listed in Table 1.

Comparative Example 2

The same procedure as in Example 1 was repeated except that the ultraviolet curable pressure sensitive adhesive (C) mixed with low-molecular-weight acrylate was used in place of the ultraviolet curable copolymer (A), that the compound B2 was used in an amount of 3 parts by weight as the photopolymerization initiator, and that the crosslinking agent was used in an amount of 0.10 part by weight. The results are listed in Table 1.

TABLE 1

| | Pressure sensitive adhesive component pts. wt. | Photopolymerization initiator pts. wt. | Crosslinking agent pts. wt. | No. of breakages | Gas ($\mu$g/cm$^2$) before UV irradiation | Gas ($\mu$g/cm$^2$) after UV irradiation | Adhesive transfer no. of chips |
|---|---|---|---|---|---|---|---|
| Example 1 | A: 100 | B1: 0.16 | D: 0.062 | nil | 4.3 | 0.9 | 0 |
| Example 2 | A: 100 | B1: 0.16 | D: 0.062 | nil | 3.9 | 0.7 | 0 |
| Comp. Ex. 1 | A: 100 | B2: 6 | D: 0.062 | 3 | 63 | 20 | 5 |
| Comp. Ex. 2 | C: 100 | B2: 3.0 | D: 0.10 | 8 | 70 | 15 | 10 |

What is claimed is:

1. A method for processing a semiconductor wafer comprising:

adhering a first surface of the semiconductor wafer to a pressure sensitive adhesive sheet comprising a substrate, and superimposed on at least one side thereof, a layer of ultraviolet curable pressure sensitive adhesive composition comprising an ultraviolet curable copolymer having ultraviolet polymerizable groups as side chains and a phosphorous photopolymerization initiator, and processing a second surface of the semiconductor wafer in a vacuum while fixing and protecting the first surface of the semiconductor wafer.

2. The method as claimed in claim 1, wherein the phosphorous photopolymerization initiator is an acylphosphine oxide compound.

3. The method as claimed in claim 2, wherein the acylphosphine oxide compound is a compound having a CO—PO bond in its molecule.

4. The method as claimed in claim 3, wherein the acyiphosphine oxide compound is a compound represented by the formula:

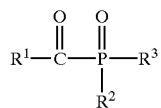

wherein $R^1$ represents an aromatic group which may have substituent, and each of $R^2$ and $R^3$ independently represents phenyl group, alkyl group, alkoxy group or aromatic acyl group which may have substituent.

5. The method as claimed in claim 1, wherein the layer of ultraviolet curable pressure sensitive adhesive composition contains 0.005 to 20 parts by weight of phosphorous photopolymerization initiator per 100 parts by weight of the ultraviolet curable copolymer.

6. The method as claimed in claim 2, wherein the layer of ultraviolet curable pressure sensitive adhesive composition contains 0.005 to 20 parts by weight of phosphorous photopolymerization initiator per 100 parts by weight of the ultraviolet curable copolymer.

7. The method as claimed in claim 3, wherein the layer of ultraviolet curable pressure sensitive adhesive composition contains 0.005 to 20 parts by weight of phosphorous photopolymerization initiator per 100 parts by weight of the ultraviolet curable copolymer.

8. The method as claimed in claim 4, wherein the layer of ultraviolet curable pressure sensitive adhesive composition contains 0.005 to 20 parts by weight of phosphorous photopolymerization initiator per 100 parts by weight of the ultraviolet curable copolymer.

* * * * *

UNITED STATES PATENT AND TRADEMARK OFFICE
CERTIFICATE OF CORRECTION

PATENT NO. : 6,723,619 B2
DATED : April 20, 2004
INVENTOR(S) : Nagamoto et al.

It is certified that error appears in the above-identified patent and that said Letters Patent is hereby corrected as shown below:

Column 11,
Lines 1-2, "acyiphosphine" should read -- acylphosphine --

Signed and Sealed this

Sixteenth Day of November, 2004

JON W. DUDAS
*Director of the United States Patent and Trademark Office*